United States Patent

[11] 3,536,133

[72] Inventors Hugo Mattsson;
Gunnar Mellgren, Vasteras, Sweden

[21] Appl. No. 725,880
[22] Filed May 1, 1968
[45] Patented Oct. 27, 1970

[73] Assignee Allmanna Svenska Elektriska Aktiebolaget
Vasteras, Sweden
a corporation of Sweden

[32] Priority May 8, 1967
[33] Sweden
[31] 6,373/67

[54] MEANS FOR COOLING SEMICONDUCTOR ELEMENTS ON TWO SIDES
2 Claims, 2 Drawing Figs.

[52] U.S. Cl. 165/80, 165/177, 174/15, 317/100, 317/234
[51] Int. Cl. F28f 7/00, H01l 1/12
[50] Field of Search 317/234, 100; 165/80, 177, 179; 174/15; 62/3

[56] References Cited

UNITED STATES PATENTS

| | | | |
|---|---|---|---|
| 515,974 | 3/1894 | Schwoerer | 165/179X |
| 3,178,894 | 4/1965 | Mole et al. | 62/3 |
| 3,178,895 | 4/1965 | Mole et al. | 62/3 |
| 3,196,620 | 7/1965 | Elfring et al. | 62/3 |
| 2,815,472 | 12/1957 | Jackson et al. | 317/100X |
| 3,204,157 | 8/1965 | Peterson | 317/234 |
| 3,344,315 | 9/1967 | Schneider | 317/100 |

*Primary Examiner*—Robert A. O'Leary
*Assistant Examiner*—Albert W. Davis
*Attorney*—Jennings Bailey, Jr.

ABSTRACT: A plurality of tubular cooling bodies containing labyrinth guides for the coolant are arranged in end-to-end relationship to form a cooling tube. Between pairs of such cooling bodies are arranged semiconductor elements which are in heat exchange relationship with the outer surfaces of the cooling bodies. The cooling bodies are arranged in a frame and between the bodies and the frame are compressing members which compress the cooling bodies longitudinally and also transversely so that the semiconductor elements are pressed between the cooling bodies. Insulating spacers are arranged between successive cooling bodies.

INVENTOR.
HUGO MATTSSON
GUNNAR MELLGREN
BY
Jennings Bailey, Jr.

INVENTOR.
HUGO MATTSSON
GUNNAR MELLGREN
BY
Jennings Bailey Jr

MEANS FOR COOLING SEMI-CONDUCTOR ELEMENTS ON TWO SIDES

BACKGROUND OF THE INVENTION

Field of the Invention

The present invention relates to a means for effecting cooling of semiconductor elements, such as diodes, thyristors and the like, by cooling them on both sides.

SUMMARY OF THE DISCLOSURE

The invention is characterized in that each semiconductor element is arranged between two tubular cooling bodies in heat-conducting contact with the outer surfaces of the cooling bodies, that several cooling bodies are arranged one after the other to form a cooling channel and that semiconductor elements and cooling bodies are arranged within a frame provided with means to effect a compression of the cooling channels in their longitudinal direction and to press the semiconductor elements against the outer surface of the cooling bodies.

BRIEF DESCRIPTION OF THE DRAWINGS

One example of the practical design of the invention and the advantages it provides will be described in connection with the accompanying drawings in which.

DESCRIPTION OF THE PREFERRED EMBODIMENTS

Figure 1:
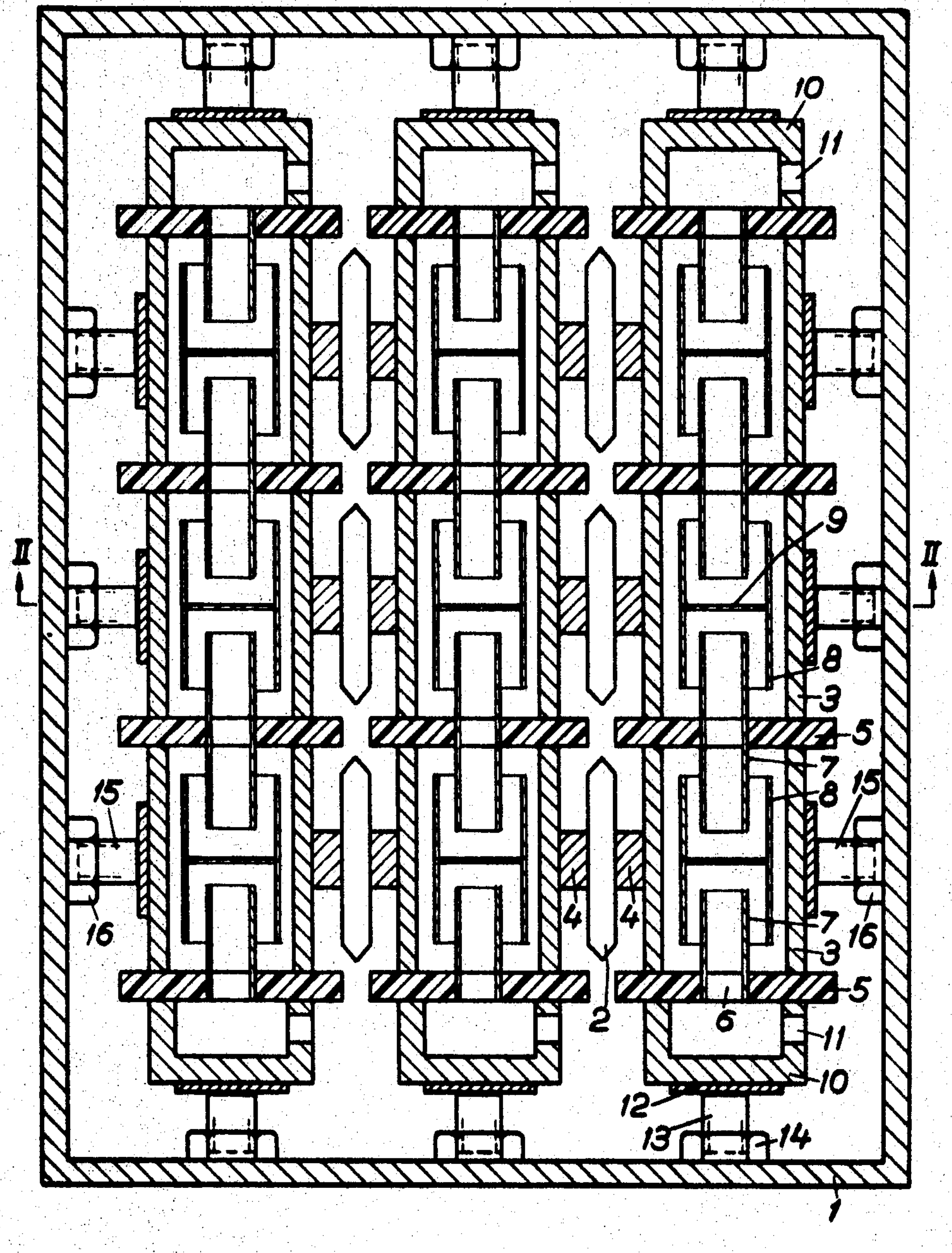
FIG. 1 shows a longitudinal section of one embodiment of the invention.
Figure 2:
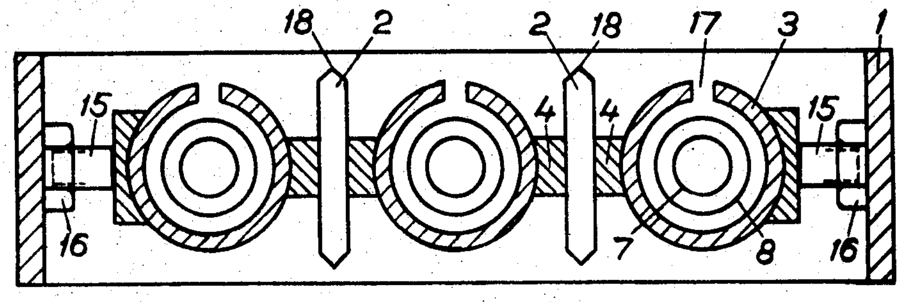
FIG. 2 is a view along the line II–II in FIG. 1.

According to FIGS. 1 and 2 the semiconductor elements and cooling bodies are arranged in a frame 1. The device shown has six semiconductor elements which are designated 2. The cooling bodies 3 consisting of heat-conducting material are in this case shaped as cylindrical tubes, but may of course have a different shape with, for example, square cross section. Between the semiconductor elements and cooling bodies is a heat-conducting spacer 4. The cooling bodies are separated by plates 5 of insulating material which are so dimensioned that the required insulation is obtained if two adjacent cooling bodies have different potentials. The plates have a central, through-running channel 6 to provide a connection for the coolant between the cooling bodies. In the channel 6 is a tube 7 of insulating material which, together with a second tube 8 with an intermediate wall 9 situated in the cooling body, forms a labyrinth for the coolant. Three cooling channels are shown in FIG. 1, each formed by three cooling bodies arranged one above the other. Each cooling channel ends in a connection housing 10 provided with an inlet or outlet 11 for cooling and connection means, not shown, for tubular conduits containing coolant. In order to achieve satisfactory sealing between the cooling bodies 3 and insulating plates 5 the free surface of the connection housing has a pressure plate 12 against which abuts one end of a screw 13. This screw is threaded at its other end and provided with a nut 14 abutting the frame 1. Both ends of the stack forming the cooling channel have such a tensioning means and with the help of these means cooling bodies and plates can be pressed together so that a satisfactory sealing is obtained between the parts in the cooling channel.

The described tensioning means with screw and nut is also used to obtain good contact between the semiconductor elements and cooling bodies. Those semiconductor elements and cooling bodies which lie opposite each other in horizontal plane are pressed against each other with the help of the screws 15 and nuts 16.

Current supply to the semiconductor elements takes place through cables inserted in the hollow cooling bodies through pipe fittings in openings 17 in the cooling bodies, as indicated in FIG. 2. These openings are suitably arranged centrally on the outer surface of the cooling body. If the semiconductors used are thyristors the conductors for the control current are attached at the periphery of the semiconductor and are designated 18 in FIG. 2.

When the means according to the invention is being assembled, the screw joint 15, 16 is first taken up which provides thermal and electrical contact between the semiconductor elements and cooling bodies. Next the screw joint 13, 14 is taken up perpendicularly to provide sealing pressure for the cooling channels. The whole device is then locked into the frame.

An important advantage with the invention is that by using a few types of standard elements it is possible to construct practically any type of rectifier bridge with a suitable number of semiconductor elements connected in parallel or in series. The connection according to FIG. 1 may thus be a three-phase, two-pulse, two-way rectifier.

By using larger frames and more elements, for example 24 semiconductor elements arranged in four vertical columns and six horizontal rows, a similar connection is obtained with two parallel rows of two series-connected elements in each row for each phase and direction. It is thus simple to construct a rectifier bridge for almost any currents and voltages and always have satisfactory cooling of the semiconductor elements.

I claim:

1. In combination, a frame, a plurality of spaced pairs of tubular cooling bodies of electrically conductive material arranged one after the other to form a pair of cooling channels, a plate of electrically insulating material between successive cooling bodies of each cooling channel, having an opening therein mating with the cooling channel, each of said cooling channels being provided with a connection housing at each of its ends, each of said connection housings being provided with an opening by means of which cooling fluid is supplied to or exhausted from the channels, a semiconductor element arranged in the free space between and in electric and heat-exchange relationship with the outer surface of each pair of the cooling bodies, means extending between the frame and the cooling bodies nearest the frame to compress the cooling bodies fluidtightly against each other longitudinally of the channels and to press the cooling bodies towards each other transversely of the channels against the semiconductor elements.

2. In a device according to claim 1, the cooling bodies being internally provided with labyrinth guides for the coolant.